United States Patent [19]

Masami et al.

[11] 4,358,349

[45] Nov. 9, 1982

[54] METHOD OF FORMING ELECTRICAL WIRING PATH ON INSULATIVE SUBSTRATE

[75] Inventors: Takagi Masami; Nakayama Shunichi; Honda Kazuyoshi, all of Osaka, Japan

[73] Assignee: Matsushita Electric Works, Ltd., Osaka, Japan

[21] Appl. No.: 233,596

[22] PCT Filed: Mar. 13, 1980

[86] PCT No.: PCT/JP80/00042

§ 371 Date: Jan. 26, 1981

§ 102(e) Date: Jan. 26, 1981

[87] PCT Pub. No.: WO80/02632

PCT Pub. Date: Nov. 27, 1980

[30] Foreign Application Priority Data

May 24, 1979 [JP] Japan .................. 54/64786

[51] Int. Cl.$^3$ .................. C25D 5/00; C25D 17/18
[52] U.S. Cl. .................. 204/15; 204/38 B; 204/297 M
[58] Field of Search .................. 204/15, 38 B, 297 M
[56] References Cited

U.S. PATENT DOCUMENTS

| 3,274,092 | 9/1966 | Marantz | 204/15 |
| 3,306,830 | 2/1967 | Bittrich | 204/15 |
| 3,582,477 | 6/1971 | Gelb | 204/297 M |
| 3,763,027 | 10/1973 | Pearson | 204/224 R |
| 4,264,416 | 4/1981 | Noz | 204/15 |

FOREIGN PATENT DOCUMENTS

| 12-8163 | 7/1937 | Japan . | |
| 32-6013 | 8/1957 | Japan . | |
| 36-4873 | 5/1961 | Japan . | |
| 42-3852 | 2/1967 | Japan . | |
| 44-28832 | 11/1969 | Japan . | |
| 45-11277 | 8/1970 | Japan . | |
| 46-26570 | 8/1971 | Japan . | |
| 840544 | 7/1960 | United Kingdom | 204/15 |
| 1098182 | 1/1968 | United Kingdom | 204/15 |

Primary Examiner—T. Tufariello
Attorney, Agent, or Firm—Burns, Doane, Swecker & Mathis

[57] ABSTRACT

A method of this invention for forming electrical wiring paths on an insulative substrate by means of an electroplating only at necessary portions on the insulative substrate comprises steps of forming on the insulative substrate a plated metal foundation layer which comprises an extremely thin conductive metal layer, closely fitting onto this extremely thin layer a first mask member from which the necessary portions for forming the electrical wiring paths are removed and having a surface to which no plating is applicable, forming a first plated layer of such metal as copper on the extremely thin conductive metal layer over the first mask member, closely fitting onto the first plated layer a second mask member from which some but not all portion of the electrical wiring paths of the first mask member are removed, forming a second plated layer of a second metal on the second mask member, and removing the first and second mask members and thus exposed portions of the extremely thin conductive metal layer, whereby the electrical wiring paths can be formed of a first metal only at the necessary portions on the insulative substrate, so that the amount to be used of such conductive first metal as copper can be reduced and it can be made possible to have a different second metal selectively plated on some but not all of such electrical wiring paths so as to improve environmental durability, to have the same first and second metal plated so as to improve the environmental durability, and to have the same first and second metal plated so as to increase the thickness of such electrical wiring paths and thereby increase the current flowing capacity.

9 Claims, 29 Drawing Figures

METHOD OF FORMING ELECTRICAL WIRING PATH ON INSULATIVE SUBSTRATE

FIELD OF THE INVENTION

This invention relates to methods of forming electrically conductive wiring paths on insulative substrates and, more particularly, to a method of forming the electrical wiring paths on the insulative substrate by means of an electroplating for interconnecting electronic circuit components disposed on a single substrate.

BACKGROUND OF THE INVENTION

As a general one of conventional methods of the kind referred to, there has been known a method of forming the electrical wiring paths by performing, for example, an etching, leaving necessary portions of a copper foil surface of a copperclad laminate in which a copper foil is adhered over the entire surface of one or both sides. According to this method, however, there has been a problem that the same is uneconomical and wasting of resources since portions other than the electrical wiring paths of the copper foil are removed by a chemical liquid of ferric chloride or the like.

As a solution to this problem, it is sufficient to have a conductive metal material adhered only to those portions on the insulative substrate where the electrical wiring paths are to be formed, and many methods for this purpose have been suggested. In these methods, the portions on the insulative substrate other than the electrical-wiring-path forming portions are masked so that only the necessary portions will have the conductive metal material adhered thereto and, for this masking, it has been practiced to paint or print a masking material onto the insulative substrate or to adhere such a soft packing material as silicone rubber.

However, in the method using the foregoing masking material, steps of painting or printing the masking material and of removing the same are required, and problems are involved not only in the time required therefor, but also in the complicacy of the steps. In the method in which the packing material is used, further, it involves a difficulty in maintaining the precision in the positioning and cannot be employed for forming the electrical paths of complex electronic circuit. Furthermore, when considerations are given to anti-corrosion plating, solder plating, and thick plating to be performed selectively with respect to the formed electrical wiring paths, there has been a problem that, with the foregoing method, further complicated steps are required, and production time is rendered prolonged.

A primary object of the present invention is to provide a method of forming the electrical wiring paths on the insulative substrate which is capable of forming only a pattern of the electrical wiring paths, permitting the saving of copper or the like metallic material and, in addition, allowing the electrical wiring paths to be formed easily and highly efficiently on the insulative substrate. Another object of the present invention is to provide a method for forming electrical wiring paths on an insulative substrate in which a second plated layer can be easily formed on a plated layer formed on the insulative substrate, and which facilitates a selective anti-corrosion plating at portions specifically requiring corrosion resistivity in the electrical wiring paths formed on the insulative substrate, a selective solder plating at portions specifically requiring the solder plating within the electrical wiring paths or, further, a selective thick plating at portions specifically requiring a large capacity electric current flow in the electrical wiring paths.

DISCLOSURE OF THE INVENTION

In accordance with the present invention, the foregoing objects are achieved in such that a mask member is closely fitted onto an insulative substrate on which an extremely thin conductive metal layer is formed, a metal plating is then applied thereon, the mask member is removed, thereafter portions of the metal layer on which the metal plating is not applied are removed, a second mask is further closely fitted onto the cut metal layer if required, and the metal plating is further performed.

An example is as follows:

| | |
|---|---|
| CuSO$_4$.5H$_2$O | 10gr/liter |
| NiCl$_2$.6H$_2$O | 2gr/liter |
| NaOH | 10gr/liter |
| 37% Formalin | |
| K.Na(C$_4$H$_4$O$_6$).H$_2$O | 30gr/liter |
| NaCO$_3$ | 20gr/liter |
| Water | 1 liter |

The extremely thin conductive metal layer 2 may not always be formed by means of non-electrolytic plating, but can be also formed by means of an evaporation, melt spray or the like of copper.

Figure 1:
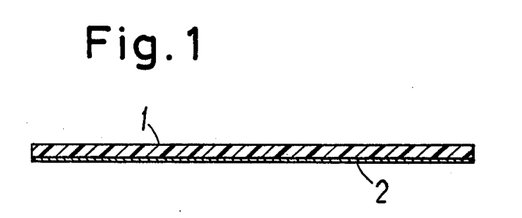
FIG. 1 is a vertically sectioned view of the insulative substrate 1 of the present invention on which the extremely thin conductive metal layer 2 is formed.
Figure 2:
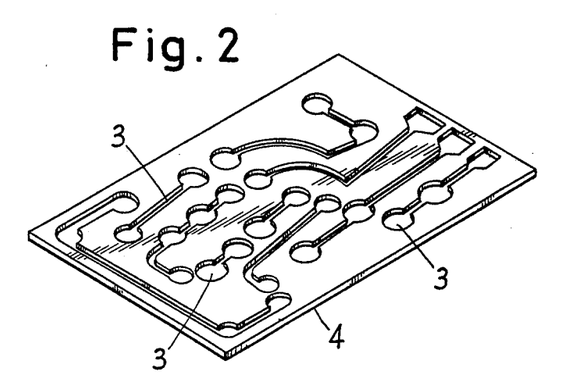
FIG. 2 is a perspective view of the mask member in FIG. 1.
Figure 3:
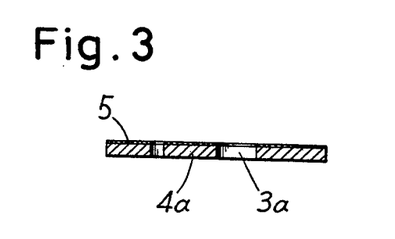
FIG. 3 is a sectioned view showing another embodiment of the mask member of the present invention.

As shown in FIG. 1, the extremely thin conductive metal layer 2 of which metal is copper and of a thickness of about 0.1 to 1$\mu$ is formed substantially over the entire surface on one side of an insulative substrate 1 by means of a non-electrolytic plating. After this first step is completed, a mask member 4 is closely fitted to this extremely this conductive metal layer 2 substantially over its entire surface. The mask member 4 shown in FIG. 2 is such an insulating sheet as polyester film, which may be the one provided with punched holes 3 made by punching in a pattern of portions where the electrical wiring paths are required to be formed, a thin plate-shaped member of ceramics, or even a metallic plate 4a provided with punched holes 3a and an extremely thin insulative coating 5 of, for example, about 30$\mu$ formed on the surface as shown in FIG. 3. What is essential is that the mask member formed by any one of the above-mentioned methods be closely fitted over the foregoing extremely thin conductive metal layer and have a surface upon which no plated layer can be formed on the surface. However, in consideration of the mask member to be closely fitted onto the extremely thin conductive metal layer, it is preferably that the mask member comprises a thin foil of such magnetic metal as permalloy and semendur in which the punched holes 3a are provided by punching off the pattern of portions where the electrical wiring paths are required to be formed and thereafter the thin insulative coating 5 is formed on the surface. Plate thickness of this mask member may be about 0.1 mm to 1.0 mm but, when the mask member is manufactured with the electrical wiring paths of a spacing of about 0.1 mm between the respective paths, the mask member can be obtained by making the plate thickness smaller and performing an etching or laser work.

Figure 4A:
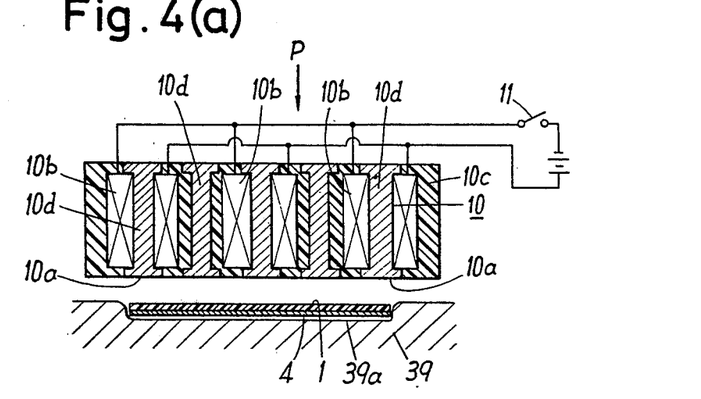
FIG. 4(a) is a schematic view of the second step of the present invention, FIGS. 4(b) and (c) are perspective views of the electromagnets.

When the mask member is of a magnetic material, as shown in FIG. 4(a), the insulative substrate 1 is placed over the mask member 4 in such manner that the extremely thin conductive metal layer 2 will be on the upper side of the mask member 4 positioned within a recess 39a of a base 29. An electromagnet 10 is brought down in this state in the direction P to be above the insulative substrate 1, and the descending of the electromagnet 10 is stopped at a position where attracting surface 10a of the electromagnet 10 is in contact with the insulative substrate 1. A switch 11 is closed to cause a current to flow through coils 10b of the electromagnet 10 so as to have the mask member 4 attracted to the electromagnet 10 with the insulative substrate 1 interposed, and the second step is completed. Accordingly, the mask 4 is closely fitted against the extremely thin conductive metal layer 2 of the insulative substrate 1. While the thickness of the insulative substrate 1 is dependent also on the attracting force of the electromagnet 10, a sufficient wall thickness will be up to about 2.0 mm.

Figures 4B, 4C:
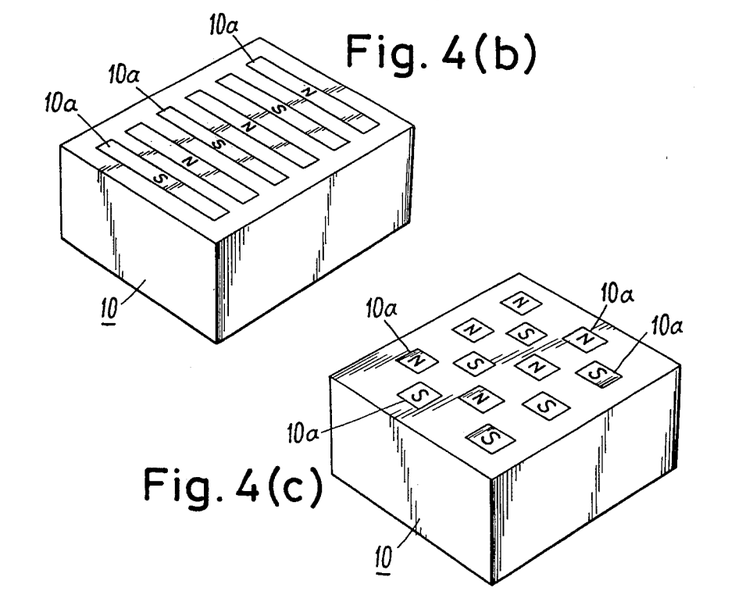

The electromagnet 10 has a plurality of iron cores 10d, coils 10b are mounted on every other ones of the iron cores 10d, and attracting surfaces 10a of the cores 10d having the coils 10b mounted are arranged to have all the same polarity. Also, as shown in FIG. 4(b), all of the iron cores are secured together by an epoxy resin so that all of the attracting surfaces 10a will be flush with each other. The distribution of magnetic lines of force can be made more uniform by arranging the iron cores 10d of the electromagnet shown in FIG. 4(b) as divided into small pieces as in FIG. 4(c).

Next, at a third step of a plated metal layer 15 consisting of copper is formed on the extremely thin conducting metal layer 2 over the mask member 4, whereas, when the mask member 4 is attracted by a permanent magnet, it may be dipped entirely within such a copper plating bath as, for example,

| | |
|---|---|
| CuSO$_4$.5H$_2$O | 250gr/liter |
| H$_2$SO$_4$ | 60gr/liter |

Figure 7:
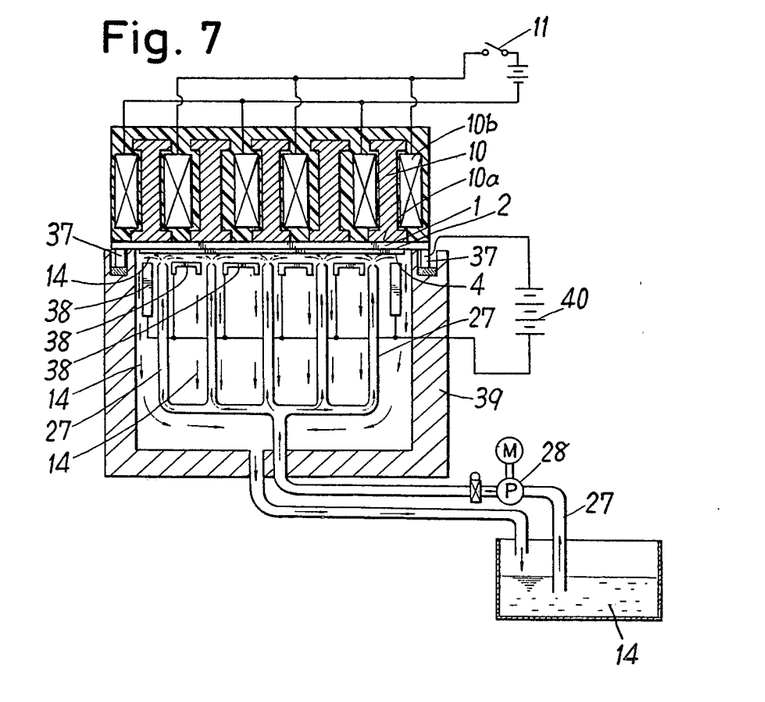
FIG. 7 is a schematic view of the third step of the present invention, FIGS. 8(a) and (b) are schematic views of the fourth step of the present invention.
Figures 8A, 8B:
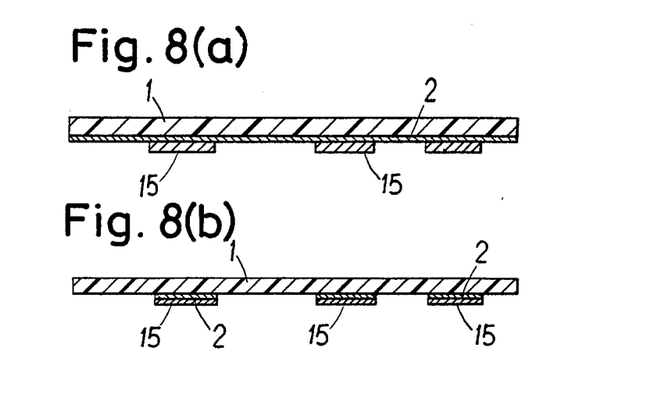

When the mask member 4 is attracted by the electromagnet 10, a copper plating solution 14 pressurized by means of a pump 28 or the like is sprayed, as in FIG. 7, at a flow rate of, for example, 6 meters per second. At this time, the extremely thin conducting metal layer 2 is caused to be in contact with an electrode 37 so as to be a cathode, and an anode 38 is positioned so as to be spaced about 5 millimeters from the mask member 4. The plating solution 14 is sprayed in this manner for about 4 minutes, whereby the plated metal layer 5 of, for example, about 35$\mu$ is selectively formed on the extremely thin conducting metal layer 2 only at the portions to be made as the electrical wiring paths along the pattern of the punched holes 3 in the mask member 4, and the third step is completed. When the plated metal layer 5 is made to be about 70$\mu$, the plating time is made to be about double. In this plating step, a current of about 100 A was flown between the anode and the cathode. As the cathode 37 generates heat, therefore, water cooling has been applied thereto. The time required for this plating step varies depending upon the thickness of the plated metal layer 5, electric current amount and flow rate of the plating solution 14. After the third step is completed, the electromagnet 10 is removed, and the mask member 4 is removed from the extremely thin conducting metal layer 2 by stopping the excitation of the coils 10b of the electromagnet 10. Thereafter the extremely thin conducting metal layer 2 exposed on the insulative substrate 1 without having the plated metal layer 15 as in FIG. 8 is removed as fused by such etchant as ferric chloride solution or the like, and the electrical wiring paths are formed on the insulative substrate 1 by the plated metal layer 15.

Figure 9:
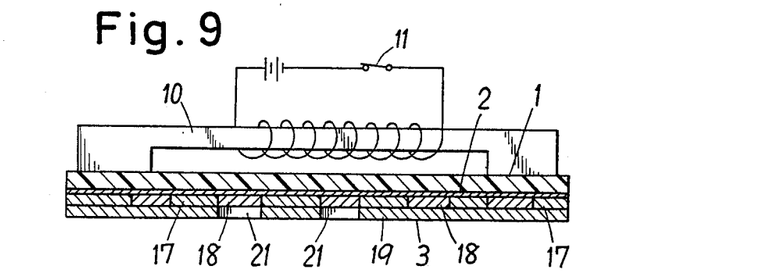
FIG. 9 is a schematic view of the fourth step in another development of the invention.
Figure 10:
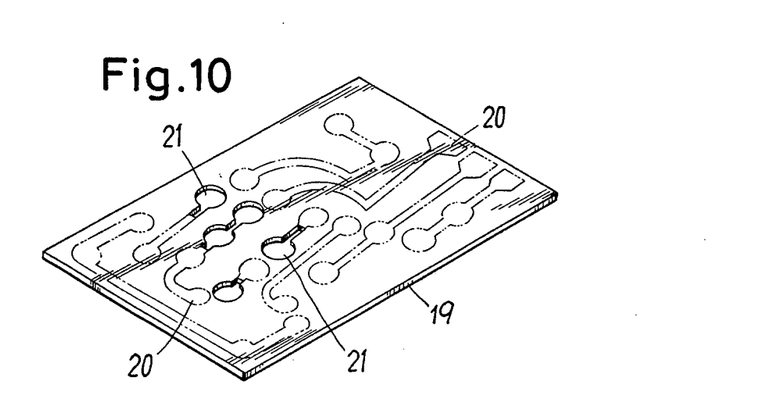
FIG. 10 is a perspective view of the second mask member of the present invention, FIGS. 11(a) and (b) are schematic views of the sixth step in the present invention.
Figure 11A:
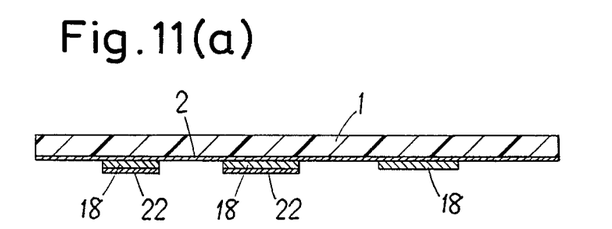
Figure 11B:
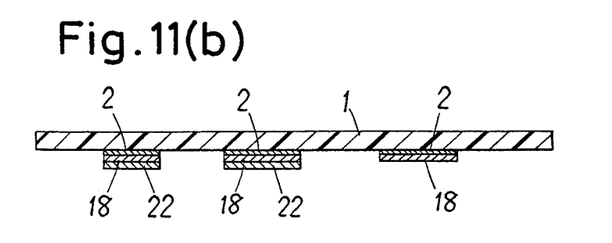
Figure 12:
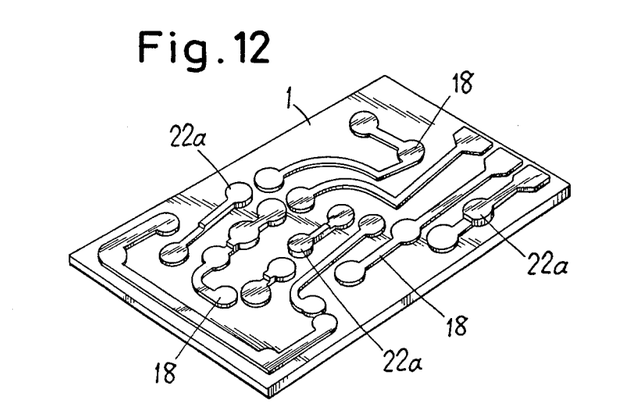
FIG. 12 is a perspective view of the insulative substrate of the present invention.

As has been described above, because there is formed on the insulative substrate 1 the extremely thin conducting metal layer 2, it is possible to form by the plating only the required circuit pattern on the extremely thin conducting metal layer 2 by forming the plated metal layer 15 on the extremely thin conducting metal layer 2 over the mask member 4. As the extremely thin conducting metal layer 2 is formed extremely thin, further, the amount of metal removed is small even though the non-electrolytically plated metal layer 2 is removed at the portions where the plated metal layer 15 is not formed. Yet, in the case where the insulative coating 5 is formed on the surface of the mask member 4, the latter is not subjected to the plating at the time of forming the plated metal layer 15 so that the mask member is utilizable many times, the circuit pattern only can be easily formed by the plating on the insulative substrate 1 while even saving such metal material as copper, and further the electrical wiring paths can be formed on the insulative substrate 1 in a simple and efficient manner. In addition, there is a feature that, as the mask member 4 in which the necessary portions for forming the electrical wiring paths are punched out is made of the magnetic material, the mask member 4 can be easily attracted by the magnet to the insulative substrate 1 so as to be highly efficient and excellent in the close fitting ability, whereby the plated metal layer 15 can be clearly formed. After the completion of a third step wherein a first plated layer 18 which is substantially identical to the plated metal layer 15 is formed on the extremely thin conductive metal layer 2 over a first mask member 17 which is substantially identical to the mask member 4, a second mask member 19 is closely fitted substantially over the entire surfaces of the first plated layer 18 and first mask member 17, as in FIG. 9. In the case where the mask member is of the magnetic material on which the insulative coating is formed, the attraction is made by a permanent magnet or electromagnet 10. As shown in FIG. 10, a second mask member 19 which is partially punched at portions corresponding to the punched holes 20 of the first mask member 17 and which is provided with punched holes 21, comprises the same material as the first mask member 17 and is attracted to the first plated layer 18 to complete the fourth step. Following this, a second plated layer 22 is formed on the first plated layer 18 through the second mask member 19 in the same manner as in the third step to complete a fifth process, after which the first and second mask members 17 and 19 are removed from the first plated layer 18. Because the second mask member 19 was only partially punched (see FIGS. 9 and 10), only specific portions (i.e., some but not all portions) of the first plated layer 18 are exposed to receive the second plated layer 22. Thus, those specific portions will be thicker than the remaining portions which were not exposed, as depicted in FIGS. 11(b) and 12. Only the extremely thin conductive metal layer 2 exposed on the insulative substrate 1 as having no first plated layer 18 formed thereon as in FIG. 11 is removed as fused by the etchant of ferric chloride solution or the like, and the electrical wiring paths are formed on the insulative substrate 1 with the first plated layer 18 having partly the second plated layer 22 formed. In forming the second plated layer 22 at the fifth step, the second plated layer 22 may have a corrosion resistivity if this second plated layer 22 is formed of gold, rhodium or the like metal. In the case when this conductive layer is utilized as a sliding contact, the contacting reliability and wear-proofness are improved in addition to the corrosion resistivity so that a corrosion resistive plated layer 22a as in FIG. 12 can be selectively formed only at portions of the electrical wiring paths where the corrosion resistivity and contacting reliability are required, whereby the electrical wiring paths can be provided with the corrosion resistivity and contacting reliability very simply and highly efficiently, any functional deterioration of printed board due to the corrosion and unfavorable contacting performance due to any oxidation and sulfuration can be prevented from occurring to improve the reliability, and the second plated layer 22 which can be partially formed renders costs for materials to be economical. In forming the second plated layer 22 with rhodium, further, a rhodium sulfate bath prepared in, for example, rhodium concentration of 1gr/liter and sulfuric acid concentration of 80 gr/liter may be employed and, also, the corrosion resistivity may further be improved by providing an organic film coating on the second plated layer 22. As a plating solution, the one as follows, for example, is used:

| Stannous borofluoride | 200gr/liter |
| Lead borofluoride | 40gr/liter |
| Borofluoric acid | 240gr/liter |
| Formalin (30%) | 10cc/liter |
| A small amount of other additive for providing luster | |

Figure 13:
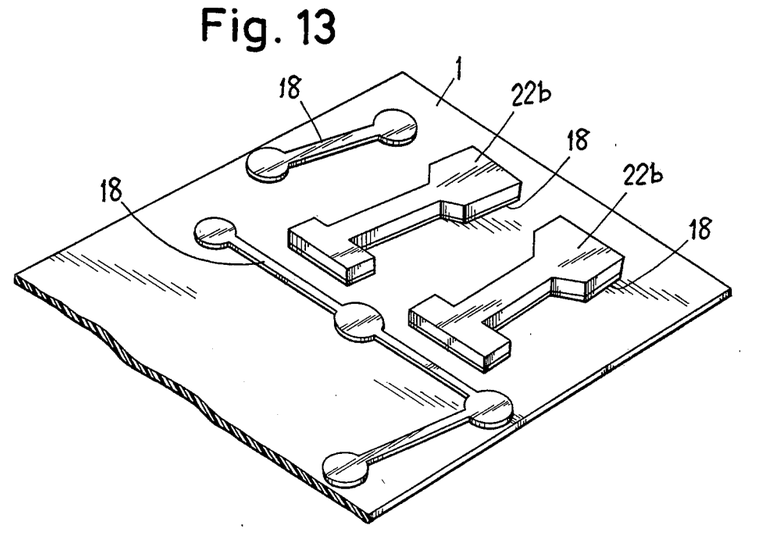
FIG. 13 is a fragmentary magnified view of FIG. 12.
Figure 14:
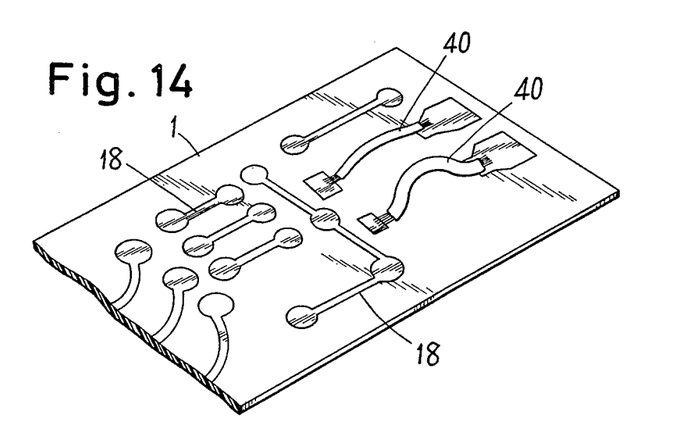
FIG. 14 is a fragmental perspective view of a conventional example, FIGS. 15(a) and (b) and 16 are fragmental sectioned views of the mask members comprising the metallic pattern having the insulative coating.

When the above composition is employed, the second plated layer 22 can be formed in the form of a solder plated layer, which can be selectively formed only at portions of the electrical wiring paths where the solderability is required, so that the solder plated layer may not be necessitated to be formed at any unnecessary portion, the electrical wiring path can be provided with the solderability economically and efficiently, and tip-terminals of tipped electronic components can easily be soldered to printed circuit even when the electrical wiring paths are complicated and delicate. When the second plated layer 22 is formed in the same copper plated layer 22b as the metal of the first plated layer 18, a thickened copper plated layer 22b can be partially provided on the first plated layer 18 which is a copper plated layer as in FIG. 13. Such metal as copper can be plated thick to form the copper plated layer 22b only at portions of current paths which are to pass a large current, so that a trouble of forming such conventional current path as shown in FIG. 14 with lead wires 40 at any parts for flowing the large current is unnecessary, and the current paths for flowing the large current can be easily formed even in complicated and minimized circuits.

Figure 15A:
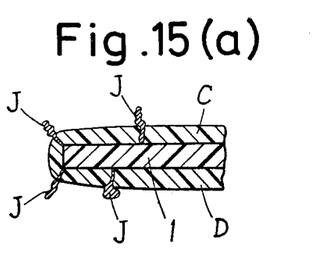
Figure 15B:
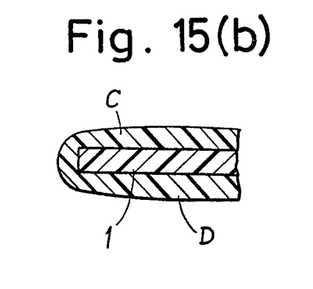

For manufacturing method of the mask member 4 of a structure in which the insulative coating 5 is formed on the surface of a metal plate or metal foil pattern, there exist methods of dipping, brush-painting, electro-deposition painted film, painted film by means of ultra-violet ray irradiation and the like of the insulating material on the metal made pattern, but these methods of forming an insulative coating 5 have been insufficient in the durability and performances and utilizations of the foregoing electrical-wiring-path forming method. There have been such defects that, for example, pinholes are easily produced specifically at edge parts to cause precipitations J of copper as in FIG. 15(a), the coating becomes thin at the edge parts but thick at flat surface parts as in FIG. 15(b) so as to be unable to achieve a coating of thoroughly uniform thickness, and so on.

Figure 16:
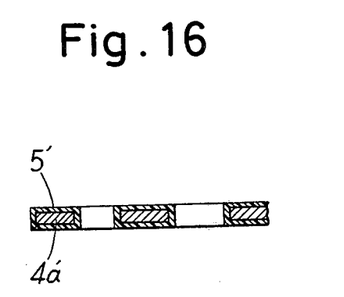
Figure 17:
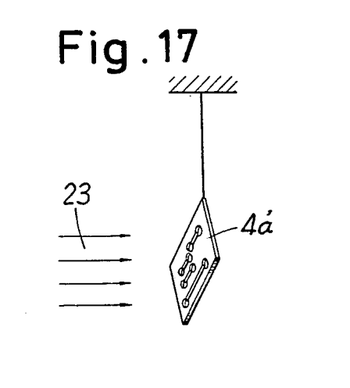
FIG. 17 is a schematic view showing the step of forming the coating of polyparaxylylene on the metallic pattern by means of the vacuum evaporation, FIGS. 18(a) and (b) are schematic views of durability testing device for the mask member comprising the metallic pattern having the insulative coating.

It has been discovered, however, that a practical mask member can be formed by employing a coating of polyparaxylylene as the insulative coating of the foregoing metallic pattern. That is, in FIG. 16, the mask member comprises a thin metal plate 4a' of such magnetic material as, for example, electromagnetic soft iron plate, iron-cobalt series alloy and the like, and an insulative coating 5' of polyparaxylene. For this polyparaxylylene, raw material polyparaxylylene is thermally decomposed at a high temperature (800° to 1000° C.), thus thermally decomposed gases 23 are sprayed against the metal plate 4'a as shown in FIG. 17 so as to have them polymerized on the surface of the metal plate 4'a, and the insulative coating 5' of polyparaxylylene is formed. For a more excellent method, as has been specifically disclosed in Japanese Patent Publication No. 15243/1963 (titled "Method of Producing P-xylene Polymers"), at least one cyclic di-P-xylylene of which basic structure is represented by a general formula is thermally decomposed at about 600° C., and its dimer is divided by the thermal decomposition into two reactive diradicals. Its general formula is:

Paraxylylene of thus obtained reactive diradicals is sprayed against the surface of the foregoing metallic pattern 4'a and cooled, and a coating of polymerized polyparaxylylene is formed. The thus formed insulative coating 5' of polyparaxylylene is uniform in the thickness and is dense without involving any pinhole since it is formed at the rate of 10 to 15 minutes per 1 micron, whereby defects such as copper precipitating to the surface, the coating at the edge part becoming thin so as not to be of uniform thickness and so on can be eliminated when the foregoing current-path method is employed. Comparisons of this with conventional examples are as in Table 1.

TABLE I

| | Insulative coating | Durability I | II |
|---|---|---|---|
| Dipping method | Epoxy series | 1 to 2 minutes | 50 to 60 hours |
| | Phenol series | 30 seconds | 10 to 20 hours |
| | Urethane series | 10 to 20 seconds | 0.5 to 1 hour |
| | Silicone series | 10 to 20 seconds | 0.5 to 1 hour |
| Electrostatic spray | Epoxy series | 5 to 10 minutes | about 30 seconds |
| Electrodeposition painting | Epoxy series | 5 to 10 minutes | 30 to 60 seconds |
| Vacuum evaporation | Polyparaxylylene | 40 to 50 hours | 500 hours no change |

In Table 1, the insulative coating is formed by the various methods and materials, and the metallic pattern 4a' having the insulative coating is dipped in a copper plating bath 24 of, for example,

| CuSO$_4$.5H$_2$O | 250gr/liter |
|---|---|

-continued

| H$_2$SO$_4$ | 60gr/liter |
|---|---|

Figure 18A:
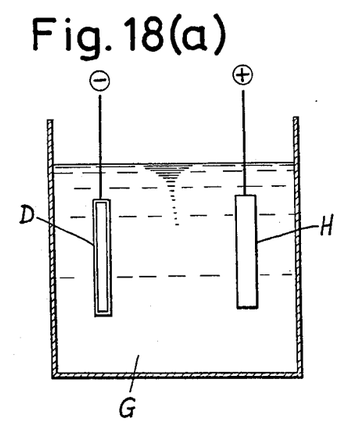
Figure 18B:
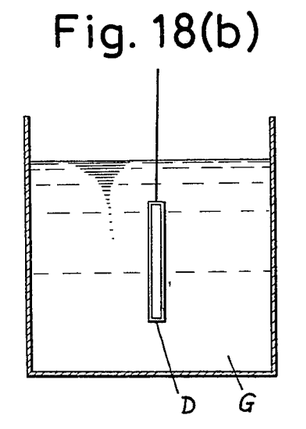

There is shown, in column I of Table 1, the time required until copper precipitates to the surface of the metallic pattern 4a' having the insulative coating after flowing an electric current while rendering the metal of the metallic pattern 4a' having the insulative coating to be the cathode and employing a copper plate 25 as the anode as shown in FIG. 18(a). There is shown in column II of Table 1, the time required until the substitution of copper takes place in a state where the metallic pattern 4a' having the insulative coating is dipped in the foregoing copper plating bath 24 but without flowing the current as shown in FIG. 18(b).

In Table 1, the case where the insulative coating is formed by the dipping method has involved such basic defects that an unevenness is apt to occur on the surface of the coating, cutouts for forming the electrical wiring paths are apt to be closed when they are small, and so on, and there has been also a defect that the thickness of the coating becomes larger. In the case according to the electrostatic spraying method, there has been a defect that the coating at the edge part becomes thinner. In the case of the electrodeposition painting method, a uniform surface coating can be obtained but the coating at the edge parts becomes smaller in the thickness. In the event when polyparaxylylene is painted by means of the vacuum evaporation, a coating of uniform thickness over the entirety including the edge parts could have been obtained. Whether the pinhole is present or not is as shown in columns I and II of the table, and it is found that in the case of polyparaxylylene the durability is provided to a degree incomparable with others.

Next, another example wherein the mask member 4 closely fitted onto the foregoing extremely thin conductive metal layer 2 shall be disclosed.

Figure 5:
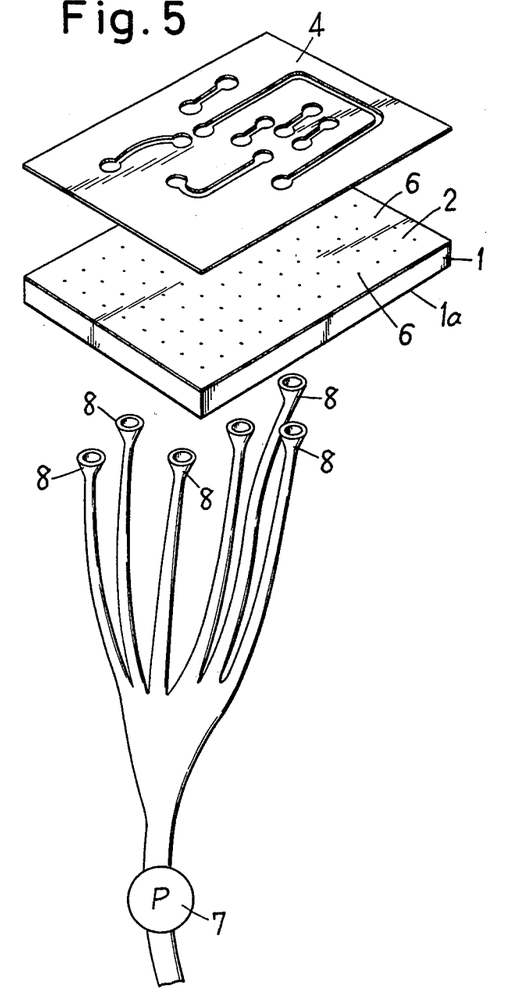
FIGS. 5 and 6 are schematic views showing other embodiments of the second step in the present invention.
Figure 6:
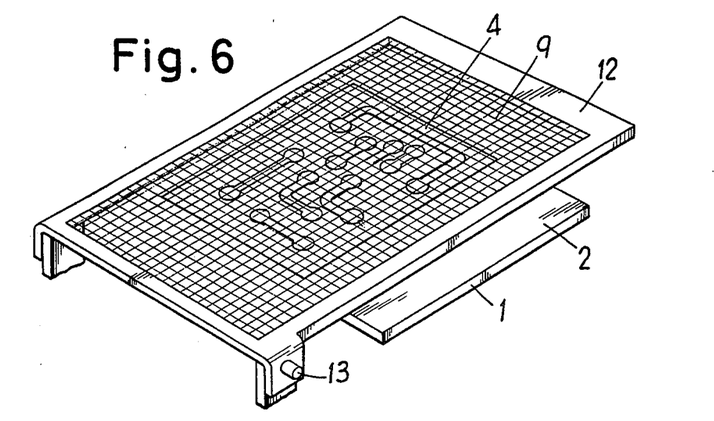

In the event where the mask member 4 is made of an insulative material or of an extremely thin insulative film formed on a non-magnetic metal plate, a method of vacuum adsorption, method of close fitting by a pressing, method of close fitting by a sandwiching, method of applying an adhesive to the mask member and causing it to adhere onto the insulative substrate and the like are considerable. An explanatory view is shown in FIG. 5 for the case of the vacuum adsorption, wherein the insulative substrate 1 is provided thereon with an extremely thin conductive metal layer over the entire surface and also with many of extremely small through-holes 6 at regular intervals. Adsorbing cups 8 are provided at an end of a vacuuming pump 7 and are fitted to the side of the reverse surface 1a of the insulative substrate 1. When the vacuum pump 7 is operated, the foregoing mask member 4 is caused to be adsorbed through the extremely small holes 6 provided in the insulative substrate 1. As shown in FIG. 6, the mask member 4 is coupled to a silk screen 9 which is pressed against the extremely thin conductive metal layer to be closely fitted thereto. A frame 12 for the silk screen is made rotatable about a shaft 13 as the center and pressed against the insulative substrate 1 on which the extremely thin conductive metal layer 2 is formed.

Figure 19:
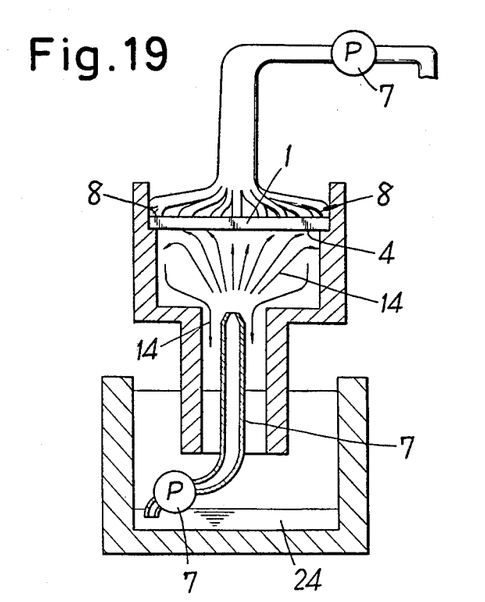
FIG. 19 is a schematic view for explaining the step of forming the plated layer 15 by spraying the plating solution 14 over the mask member 4.

Thereafter, as shown in FIG. 19, the plating solution 14 is sprayed against the mask member 4.

Figure 20:
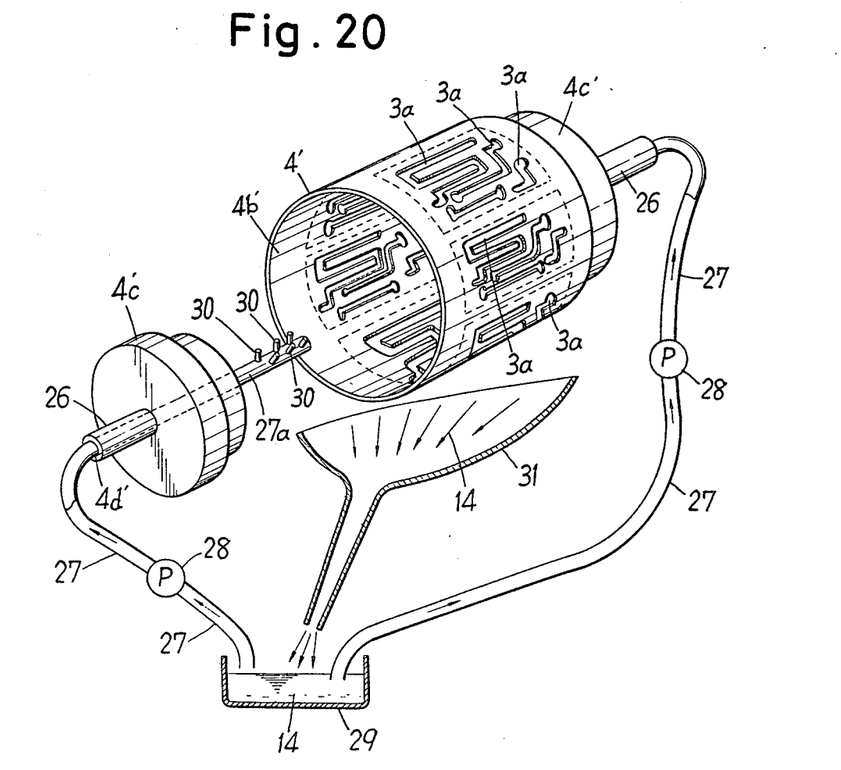
FIG. 20 is a perspective view as disassembled of the cylindrical mask member 4'.
Figures 21, 22, 23:
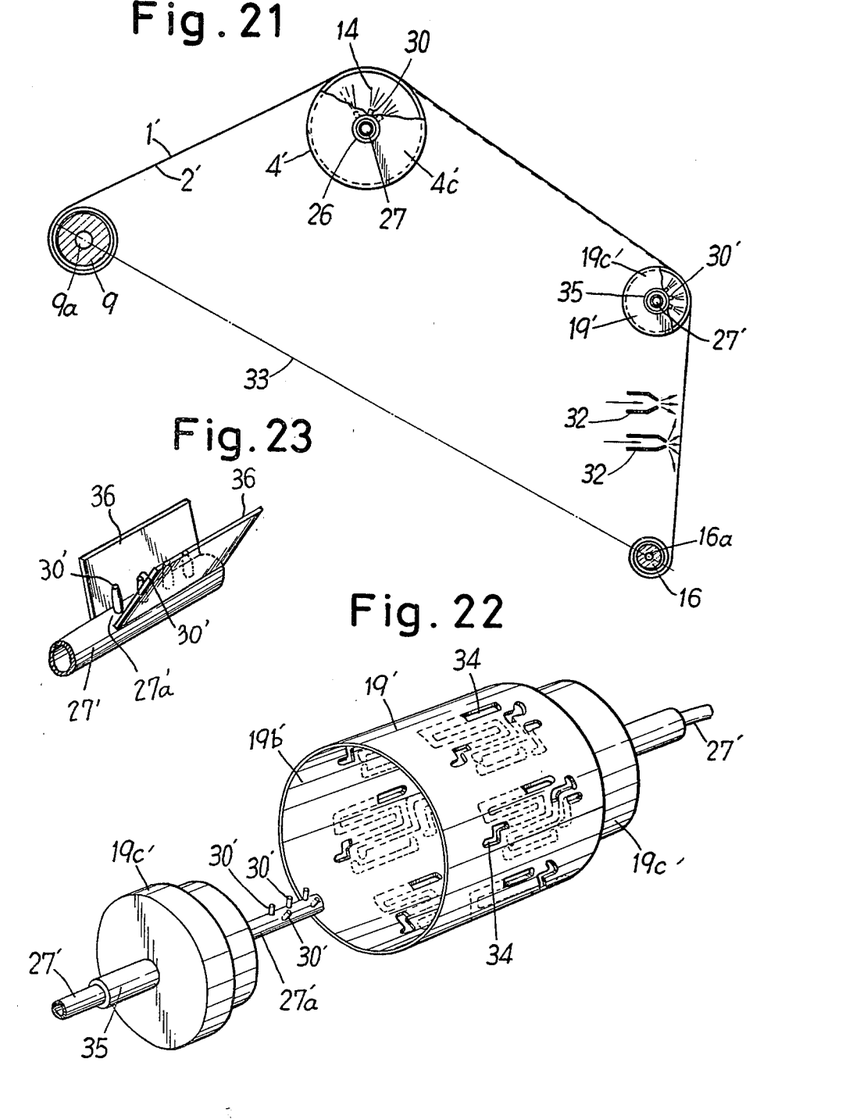
FIG. 21 is a schematic view of the step of forming the electrical wiring paths on the strip-shaped film 1' made of the flexible insulative material.
FIG. 22 is a perspective view as disassembled of the second cylindrical mask member 19'.
FIG. 23 is a fragmental perspective view showing another embodiment of the tip end 27, 27' of the pipe 27 or 27'.

There is shown in FIGS. 20 and 21 still another embodiment, which shows a method employing a strip-shaped film 1' made of a flexible insulative material as the insulative substrate and is suitable for a sequential manufacture, wherein the mask member 4 is formed as a cylinder. This cylindrical mask member 4' is provided in the outer cylindrical side surface with punched holes 3a by punching off a pattern of portions where the electrical wiring paths are required to be formed. To the strip-shaped film 1' made of the flexible insulative material, a tension is exerted by pulling it with a drum 9 taking up the film on which the extremely thin conductive metal layer 2' is formed and with a drum 16 for taking up the film 1' after a plated metal layer is formed on the film 1', to have the same closely fitted onto the surface of the cylindrical mask member 4'. The drum 9 is provided with a brake for preventing is quick rotation and an arrangement is made so that, by rotating the drum 16 slowly, the cylindrical drum 4' will rotate about a bearing shaft 26 as the center in response to movements of the film 1'. Accordingly, relative positional relationship between the film 1' and the surface of the cylindrical mask member 4' does not vary, and repetitive close fittings and removals of the mask member are made unnecessary so as to be more efficient. The taking-up of the strip-shaped film 1' by means of the drum 16 may be continuous, or the drum 16 may even be rotated intermittently to perform the taking-up. Further, to both end apertures 4b' of the cylindrical mask member 4', reinforcing members 4c' are mounted. In this reinforcing member 4c', a supporting shaft 26 provided with a through hole 4d' is integrally formed. An arrangement is made in such that pipes 27 for feeding the plating solution 14 are passed through the through-holes 4d', and the plating solution 14 is drawn up by a pump 28 from a reservoir 29 reserving therein the plating solution 14 and sprayed under a pressure out of spraying ports 30 for the plating solution provided at tip ends 27a of the pipes 27. The drums 9 and 16 have rotary shafts 9a and 16a. A receiving pan 31 acts to return the plating solution 14 to the reservoir 29. A nozzle 32 sprays an etchant for removing the extremely thin conductive metal layer 2 exposed on the surface. Further, it is preferable that the supporting shafts 26 are positioned above a line connecting between the rotary shafts 9a and 16a.

As shown further in FIGS. 21 and 22, a second mask member 19' is formed in a cylindrical shape. This second cylindrical mask member 19' is provided with punched holes 34 as partially punched off at portions corresponding to the punched holes 3a in the first mask member 4' and is born rotatably about a supporting shaft 35 as the center, and an anti-corrosive plating solution, highly solderable plating solution or the like is sprayed from the inside of such cylindrical mask member 19' to form a second plated metal layer 22' on the first plated layer 18'. A reinforcing member 19c' is mounted into respective end openings 19b' of the cylindrical mask member 19' and is provided with the supporting shaft 35. In the center of this supporting shaft 35, a through hole 19d' is provided and a pipe 27' is passed through this through hole 19d'. The pipe 27' has plating solution spraying ports 30' at its tip end 27a'.

For the purpose of preventing the plating solution 14 from scattering, such solution-scatter preventing plates 36 as shown in FIG. 23 may be provided at the tip end 27a or 27a' of the pipe 27 or 27'.

In the case when, as has been described above, the cylindrical mask member 4' is used as the mask member 4, the strip-shaped film 1' of the flexible insulative material is used as the insulative substrate 1 and the tension is exerted always on this strip-shaped film 1' to have it closely fitted to the cylindrical mask member 4'. A further effect of the foregoing is that more producibility is achieved in that, as the strip-shaped film 1' can simply be taken up by the drum 16 without requiring the close fitting and removal of the mask member to and from the extremely thin conductive metal layer, the electric paths can be formed in a sequential manner.

BEST MODE FOR THE INVENTION

A mask member having a predetermined pattern of electrical wiring paths are formed in an iron material of 0.3 mm thick and its entire surface is thoroughly insulation coated with polyparaxylylene vacuum evaporated to be of a thickness of 30 $\mu$ by means of a vacuum evaporation. An electrically insulative substrate having a surface of a phenol resin plate of 1.6 mm thick is activated by palladium and a non-electrolytic copper plating is applied thereto to be 0.5 $\mu$. The mask member is placed on the side of the non-electrolytically plated layer of the wiring substrate, and pole surfaces of electromagnets are brought into contact with the other surface of the electrical wiring substrate.

Against the mask member thus closely fitted to the electrical wiring substrate by means of the electromagnetically attracting force of the electromagnets, a copper plating solution is sprayed at a flow rate of 6 m/sec. for about 4 minutes with the foregoing electrical wiring substrate used as the cathode while supplying an electric current of about 100 A. A plated copper layer of about 35 $\mu$ is formed on the non-electrolytically plated copper layer on the electrical wiring substrate exposed through the electrical wiring path pattern of the mask member. Next, the excitation of the electromagnets is released and the mask member is separated from the non-electrolytically plated copper layer on the electrical wiring substrate.

Thereafter, masked portions of the non-electrolytically plated copper layer are removed as etched by a ferric chloride solution, whereby the electrical wiring paths comprising the plated copper layer is formed on the electrically insulative substrate.

I claim:

1. A method of forming electrically conductive paths on an insulative substrate comprising the steps of
   forming on the insulative substrate a plated metal foundation layer which comprises a thin conductive metal layer,
   closely fitting onto the thin conductive metal layer a first mask member having portions at selected locations removed forming paths and having a surface comprising a plating-resistant insulative material,
   applying an electrically conductive material over the first mask member to form a first plated layer on the thin conductive metal layer corresponding to said paths,
   closely fitting onto the surface of the first plated layer a second mask member having only specific portions removed to expose some but not all of the electrically conductive paths formed by the first plated layer and
   having a surface comprising a plating-resistant insulative material,
   applying electrically conductive material over the second mask member to form a second plated layer on said some portions of the first plated layer exposed by the second mask member, and separating the first mask member and the second mask member from the insulative substrate and thereafter removing exposed portions of the thin conductive metal layer on the surface of the insulative substrate.

2. A method of forming electrical wiring paths on an insulative substrate as described in claim 1, wherein the second plated layer is a plated layer having a contacting reliability.

3. A method of forming electrical wiring paths on an insulative substrate as described in claim 1 wherein the mask member comprises a metal material on the surface of which an insulative coating is formed.

4. A method of forming electrical wiring paths on an insulative substrate as described in claim 3 wherein the insulative coating is an insulative coating of polyparaxylylene.

5. A method of forming electrical wiring paths on an insulative substrate as described in claim 1 wherein the second plated layer is a plated layer having a corrosion resistivity.

6. A method of forming electrical wiring paths on an insulative substrate as described in claim 1 wherein the second plated layer is a soldered plated layer.

7. A method of forming electrical wiring paths on an insulative substrate as described in claim 1 wherein the second plated layer is a plated layer of the same metal as the first plated layer.

8. A method of forming electrical wiring paths on an insulative substrate as described in claim 1 wherein the insulative substrate is a flexible film.

9. A method of forming electrical wiring paths on an insulative substrate as described in claim 8 wherein the mask member is a cylindrical mask member.

* * * * *